United States Patent [19]
Yanagihara

[11] Patent Number: 5,995,322
[45] Date of Patent: Nov. 30, 1999

[54] MAGNETIC DISK APPARATUS

[75] Inventor: Shigeki Yanagihara, Tokorozawa, Japan

[73] Assignee: Kabushiki Kaisha Toshiba, Kawasaki, Japan

[21] Appl. No.: 08/889,826

[22] Filed: Jul. 8, 1997

[30] Foreign Application Priority Data

Sep. 19, 1996 [JP] Japan ................................. 8-248327

[51] Int. Cl.$^6$ .............................. G11B 5/48; G11B 21/16
[52] U.S. Cl. ...................................... 360/97.01; 360/104
[58] Field of Search ........................... 360/97.01, 97.02, 360/97.03, 104, 105, 106, 107, 108

[56] References Cited

U.S. PATENT DOCUMENTS

| | | | |
|---|---|---|---|
| 4,933,785 | 6/1990 | Morehouse et al. | 360/105 |
| 5,055,969 | 10/1991 | Putnam | 360/104 |
| 5,384,432 | 1/1995 | Noro et al. | 360/104 |
| 5,465,186 | 11/1995 | Bajorek et al. | 360/113 |
| 5,631,788 | 5/1997 | Richards | 360/104 |
| 5,644,454 | 7/1997 | Arya et al. | 360/104 |
| 5,680,274 | 10/1997 | Palmer | 360/104 |
| 5,696,651 | 12/1997 | Endo et al. | 360/104 |
| 5,737,837 | 4/1998 | Inaba | 360/137 |

OTHER PUBLICATIONS

IBM Technical Disclosure Bulletin, "Rework Feature for an Actuator Assembly", Brooks, Jr et al, vol. 33, No. 10B, pp. 392–393, Mar. 1991.

*Primary Examiner*—David L. Ometz
*Attorney, Agent, or Firm*—Finnegan, Henderson, Farabow, Garrett & Dunner, L.L.P

[57] ABSTRACT

In a hard disk drive, the leading end portion of a main FPC is fixed to the bearing assembly of a carriage assembly. A plurality of connection pads are formed on the leading end portion in sets corresponding to the number of magnetic heads. The connection pads of each set are arranged in a straight line at predetermined intervals. The connecting end portion of a head FPC fixed to the surfaces of each arm and each suspension of the carriage assembly has a plurality of second electrodes pads. These second electrode pads have the same arrangement as that of the connection pads of a corresponding set. The second electrode pads are stacked and soldered on the connection pads of the corresponding sets.

9 Claims, 8 Drawing Sheets

MAGNETIC DISK APPARATUS

BACKGROUND OF THE INVENTION

The present invention relates to a magnetic disk apparatus having a plurality of magnetic heads.

In recent years, magnetic disk apparatuses have been widely used as memories for storing information in large quantities in computers such as personal computers, laptop computers, and notebook computers.

A magnetic disk apparatus of this type generally comprises a plurality of magnetic disks stacked inside, magnetic head assemblies having a plurality of magnetic heads for recording/reproducing information on/from the magnetic disks, a carriage for movably supporting the magnetic head assemblies with respect to the magnetic disks, and a voice coil motor for moving the magnetic heads to desired track positions on the magnetic disks by rotating the carriage.

The plurality of magnetic disks are fixed to the hub of a spindle motor and coaxially supported thereon at predetermined intervals in a stacked state. The magnetic disks are rotated at a predetermined speed by driving the spindle motor.

The magnetic head assemblies having the magnetic heads are provided in pairs for the respective magnetic disks. Each pair of assemblies are positioned to oppose the upper and lower surfaces of a corresponding magnetic disk. For example, in a magnetic disk apparatus having two magnetic disks, four magnetic head assemblies are arranged.

Each magnetic head assembly includes a slider, on which a magnetic head is formed, and a suspension for exerting a predetermined load on the magnetic head. The carriage includes a bearing assembly and a plurality of arms extending from the bearing assembly. The magnetic head assemblies are fixed to the corresponding arms.

In addition, the magnetic disk apparatus includes a circuit board for processing signals for the magnetic heads. This circuit board is electrically connected to the plurality of magnetic heads with the following arrangement.

A flexible printed circuit board (to be referred to as an FPC hereinafter) extends from the circuit board. The leading end portion of the FPC is fixed to the bearing assembly of the carriage. Many connection pads are formed on the leading end portion of the FPC.

For example, two lead lines extend from each magnetic head. These lead lines extend to a portion near the bearing assembly along the suspension and the arm. The distal ends of the lead lines are soldered to the connection pads of the FPC one by one.

As personal computers and the like equipped with magnetic disk apparatuses have recently become smaller in size and higher in performance, the demand for smaller magnetic disk apparatuses having larger capacities has grown year by year. In order to increase the capacity of a magnetic disk apparatus, the number of magnetic heads and the number of magnetic disks may be increased. Alternatively, high performance magnetic heads and high performance magnetic disks may be used.

On the other hand, as the demand for smaller magnetic disk apparatuses has grown, the packing density of the components of the apparatuses has increased, resulting in a deterioration in manufacturing efficiency. Problems are posed especially in association with the connection between the lead lines of magnetic heads and the circuit board.

That is, if the number of magnetic heads and the number of magnetic disks are increased to attain an increase in capacity, the number of head lead lines increases. Similarly, if high performance magnetic heads are used, since three or four head lead lines are required for each magnetic head, the total number of head lead lines increases. Accordingly, the number of connection pads of an FPC which extend from a circuit board must be increased.

Owing to the demands for a reduction in size, it is difficult to increase the area of the FPC. When the number of connection pads is to be increased, the area of each connection pad and the intervals between the pads must be decreased.

In the above conventional magnetic disk apparatus, however, each head lead line is soldered to a corresponding connection pad of the FPC which extends from the circuit board, and the operation of connecting each lead line to a corresponding connection pad becomes cumbersome with reductions in the area of each connection pad and the intervals between the pads. In addition, only experts can handle such a painstaking job. For this reason, the assembly efficiency for magnetic disk apparatuses deteriorates, and connection faults may be caused by errors such as connection point errors.

BRIEF SUMMARY OF THE INVENTION

The present invention has been made in consideration of the above points, and has as its object to provide a magnetic disk apparatus which exhibits high assembly efficiency and can prevent connection faults and the like.

In order to achieve the above object, there is provided a magnetic disk apparatus which comprises a plurality of magnetic disks stacked on each other at predetermined intervals, a plurality of magnetic heads arranged to oppose upper and lower surfaces of each magnetic disk to record/reproduce information on/from the magnetic disks, a carriage assembly movably supporting the magnetic heads with respect to the magnetic disks, driving means for rotating the carriage assembly so as to move the magnetic heads to desired positions on the magnetic disks, and a board unit for inputting/outputting read and write signals with respect to the magnetic heads.

The carriage assembly includes a rotatable main body and a plurality of arm portions extending from the main body and supporting the respective magnetic heads.

The board unit includes a board main body, a belt-like main flexible printed circuit board extending from the board main body and having a leading end portion fixed to the main body of the carriage assembly, and a plurality of connection pads formed on the leading end portion of the main flexible printed circuit board in sets corresponding to the number of magnetic heads, the connection pads of the respective sets being formed in a predetermined arrangement.

The carriage assembly includes a head flexible printed circuit board formed on each of the arm portions to electrically connect the magnetic head to the connection pads of a corresponding set.

Each of the head flexible printed circuit boards includes a distal end portion having a plurality of first electrode pads to which the magnetic head is connected, and a connecting end portion extending from a proximal end portion of the arm portion and having a plurality of second electrode pads connected to the connection pads of the corresponding set.

The second electrode pads of each of the connecting end portions are arranged in the same manner as the connection pads of the corresponding set and stacked and soldered thereon.

According to the magnetic disk apparatus having the above arrangement, in assembly, the magnetic heads are electrically connected to the first electrode pads of the head flexible printed circuit boards fixed to the respective arm portions. The second electrode pads formed on the connecting end portion of the head flexible printed circuit boards are positioned above the connection pads of the corresponding sets on the main flexible printed circuit board side to be soldered thereto.

In this case, since the second electrode pads formed on each head flexible printed circuit board have the same arrangement as that of the connection pads of a corresponding set, the second electrode pads can be simultaneously and accurately positioned with respect to the connection pads. In this state, the second electrode pads can be soldered to the connection pads altogether by laser irradiation, a pulse heater, a soldering iron, or the like. Even if, therefore, the number of connection pads increases or the area of each connection pad decreases, the connection efficiency and reliability can be improved.

In addition, according to the present invention, there is provided a magnetic disk apparatus comprising a plurality of magnetic disks stacked on each other at predetermined intervals, a plurality of magnetic heads arranged to oppose upper and lower surfaces of each magnetic disk, for recording/reproducing information on/from the magnetic disks, a carriage assembly including a rotatable main body and a plurality of arm portions extending from the main body and respectively supporting the magnetic heads, the carriage assembly movably supporting the magnetic heads with respect to the magnetic disks, driving means for rotating the carriage assembly so as to move the magnetic heads to desired positions on the magnetic disks, and a board unit for inputting/outputting read and write signals with respect to the magnetic heads.

The board unit includes a board main body, a belt-like main flexible printed circuit board extending from the board main body and having a leading end portion fixed to the main body of the carriage assembly, and a plurality of connection pads formed on the leading end portion of the main flexible printed circuit board in sets corresponding to the number of magnetic heads, the connection pads of the respective sets being formed in a predetermined arrangement. The carriage assembly includes a head flexible printed circuit board formed on each of the arm portions to electrically connect the magnetic head to the connection pads of a corresponding set.

Each of the head flexible printed circuit boards includes a distal end portion having a plurality of first electrode pads to which the magnetic head is connected, a connecting end portion fixed to the leading end portion of the main flexible printed circuit board to be adjacent to the connection pads of a corresponding set, and a plurality of second electrode pads formed on the connecting end portion in the same arrangement as that of the connection pads of the corresponding set, opposing the connection pads, and connected thereto by wire bonding.

According to the magnetic disk apparatus having the above arrangement, in assembly, the magnetic heads are electrically connected to the first electrode pads of the head flexible printed circuit boards fixed to the respective arm portions. The connecting end portions of the head flexible printed circuit boards are fixed to the leading end portion of the main flexible printed circuit board. In this case, the second electrode pads formed on the head flexible printed circuit boards are positioned to oppose the connection pads of the corresponding sets on the main flexible printed circuit board. The respective second electrode pads are connected to the corresponding connection pads by wire bonding.

In this case, since the second electrode pads formed on each head flexible printed circuit board have the same arrangement as that of the connection pads of a corresponding set, the second electrode pads can be simultaneously and accurately positioned with respect to the connection pads. For this reason, the second electrode pads and the connection pads can be easily connected to each other by wire bonding. In addition, since wire bonding can be performed, the mount area for connecting each electrode pad to a corresponding connection pad can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 10 show a hard disk drive according to the first embodiment of the present invention, in which:

DETAILED DESCRIPTION OF THE INVENTION

An embodiment in which the magnetic disk apparatus of the present invention is applied to a hard disk drive (to be referred to as an HDD hereinafter) will be described in detail below with reference to the accompanying drawings.

Figure 1:
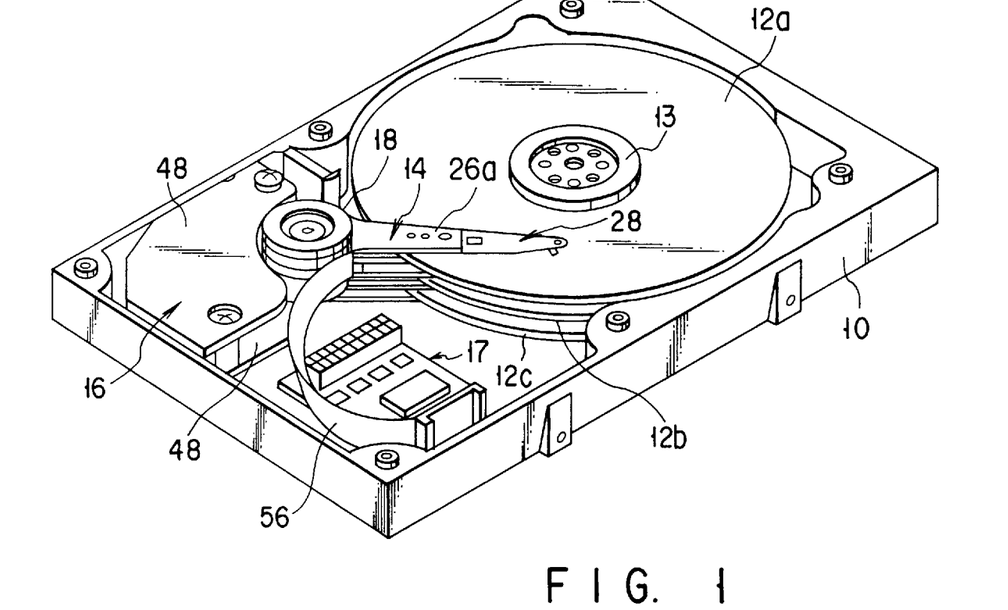
FIG. 1 is a perspective view of the interior of the hard disk drive.

As shown in FIG. 1, the HDD includes a rectangular, box-like case 10 with an open upper surface and a top cover (not shown) which is fixed to the case 10 with screws to close the upper opening of the case 10.

The case 10 houses three magnetic disks 12a, 12b, and 12c serving as magnetic recording media, a spindle motor 13 for supporting and rotating the magnetic disks, a plurality of magnetic heads for recording/reproducing information on/from the magnetic disks, a carriage assembly 14 for movably supporting the magnetic heads with respect to the magnetic disks 12a, 12b, and 12c, a voice coil motor (to be referred to as a VCM hereinafter) 16 for rotating and positioning the carriage assembly 14, and a board unit 17 having a preamplifier and the like.

A printed circuit board (not shown) for controlling the operations of the spindle motor 13, the VCM 16, and the magnetic heads through the board unit 17 is fixed to the outer surface of the case 10 with screws to oppose the bottom wall of the case 10.

Each of the magnetic disks 12a, 12b, and 12c is 65 mm (2.5 inches) in diameter and has magnetic recording layers formed on the upper and lower surfaces. The three magnetic disks 12a, 12b, and 12c are coaxially fitted on the hub (not shown) of the spindle motor 13 and stacked at predetermined intervals in the axial direction of the hub at predetermined intervals. The magnetic disks 12a, 12b, and 12c are rotated by the spindle motor 13 at a predetermined speed.

Figure 2:
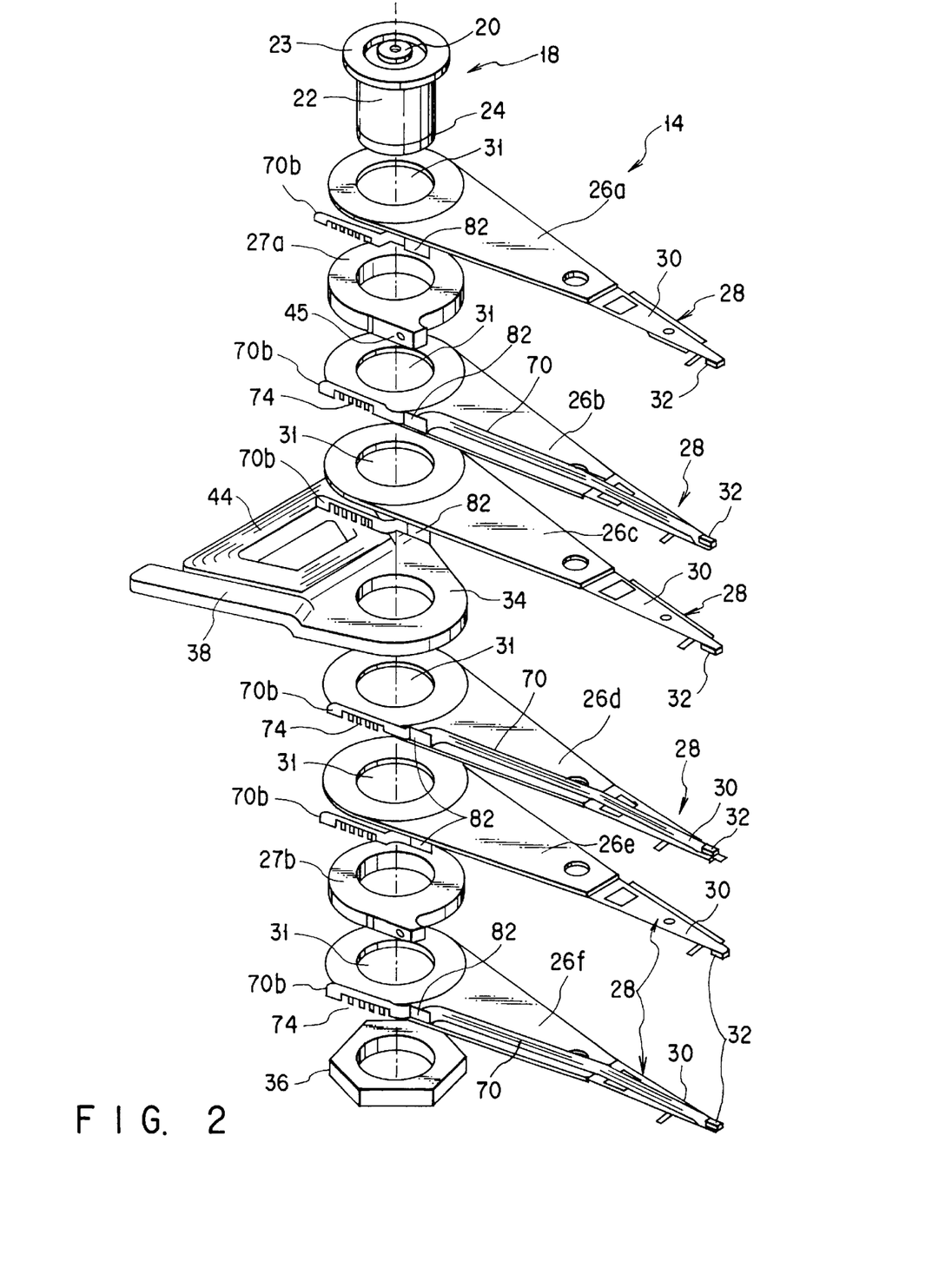
FIG. 2 is an exploded perspective view of a carriage assembly arranged in the hard disk drive.
Figure 3:
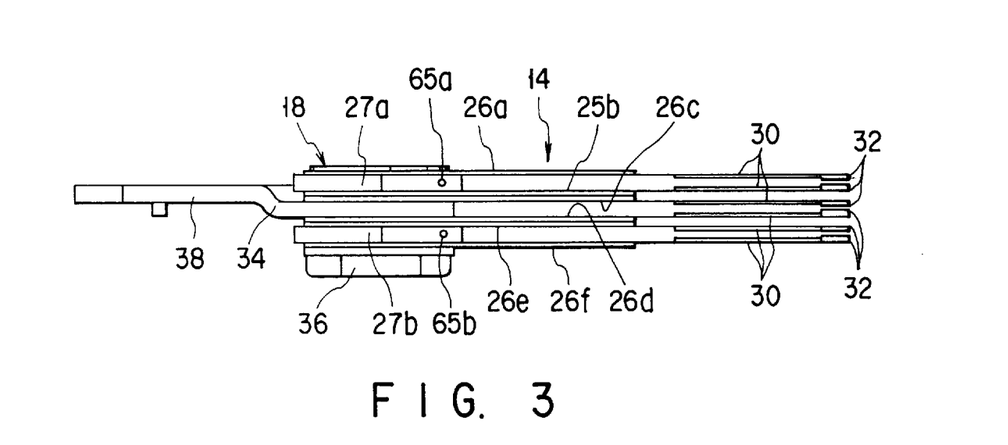
FIG. 3 is a side view of the carriage assembly.

As shown in FIGS. 1 to 3, the carriage assembly 14 has a bearing assembly 18 fixed on the bottom wall of the case 10. The bearing assembly 18 includes an axle 20 standing on the bottom wall of the case 10, and a cylindrical hub 22 rotatably supported on the axle 20 through a pair of bearings. An annular flange 23 is formed on the upper end of the hub 22, and a threaded portion 24 is formed on the outer surface at the lower end portion of the hub 22.

The carriage assembly 14 includes six arms 26a, 26b, 26c, 26d, 26e, and 26f mounted on the hub 22, two spacer rings 27a and 27b, and six magnetic head assemblies 28 supported by the respective arms.

Each of the arms 26a to 26f is made of a stainless material such as SUS304 to have a thin plate-like shape having a thickness of about 250 μm. A circular through hole 31 is formed in one end, i.e., the proximal end, of each arm.

Each magnetic head assemblies 28 includes an elongated suspension 30, and a magnetic head 32 fixed to the suspension. The suspension 30 is formed of a leaf spring having a thickness of 60 to 70 μm. The proximal end of each suspension 30 is fixed to the distal end of a corresponding one of the arms 26a to 26f by spot welding or with an adhesive so as to extend from the arm.

Each magnetic head 32 has an almost rectangular slider (not shown) and a recording/reproducing MR (Magnetoresistance) head formed on the slider, and is fixed to the gimbal portion formed on the distal end portion of the suspension 30. Each magnetic head 32 has four electrodes (not shown). Note that the suspension 30 may be integrally formed with the arm by using the same material for the arm. In addition, each suspension 30 and each arm constitute an arm portion in the present invention.

The arms 26a to 26f fixed to the magnetic head assemblies 28 are fitted on the hub 22 so as to be stacked on the flange 23 by inserting the hub 22 into the through holes 31. The spacer rings 27a and 27b are fitted on the hub 22 such that the spacer rings are respectively clamped between the arms 26a and 26b, and between the arms 26e and 26f. In addition, a support ring 34 is fitted on the hub 22 and clamped between the arms 26c and 26d.

Note that the bearing assembly 18, the spacer rings 27a and 27b, and the support ring 34 constitute the main body of the carriage assembly 14.

The six arms 26a to 26f fitted on the hub 22, the two spacer rings 27a and 27b, and the support ring 34 are clamped between a nut 36 threadably engaged with the threaded portion 24 of the hub 22 and the flange 23, and fixed and held on the outer surface of the hub 22. With this structure, the six arms 26a to 26f are placed at intervals to be parallel to each other, and extend from the hub 22 in the same direction.

The magnetic heads 32 of the magnetic head assemblies 28 mounted on the arms 26a and 26b are positioned to oppose each other, and so are the magnetic heads 32 of the magnetic head assemblies 28 mounted on the arms 26c and 26d, and the magnetic heads 32 of the magnetic head assemblies 28 mounted on the arms 26e and 26f. The arms 26a to 26f and the magnetic head assemblies 28 fixed thereto are integrally pivotal with the hub 22.

The support ring 34 has two support frames 38 extending in a direction opposite to the arms 26a to 26f. A coil 44 as part of the VCM 16 is fixed on these support frames 38.

As is apparent from FIG. 1, while the carriage assembly 14 having the above arrangement is mounted in the case 10, the magnetic disk 12a is positioned between the arms 26a and 26b; the magnetic disk 12b, between the arms 26c and 26d; and the magnetic disk 12c, between the arms 26e and 26f. The magnetic heads 32 of the magnetic head assemblies 28 mounted on the arms 26a and 26b are respectively in contact with the upper and lower surfaces of the magnetic disk 12a so as to clamp it from two sides.

Similarly, the magnetic heads 32 mounted on the arms 26c and 26d are respectively in contact with the upper and lower surfaces of the magnetic disk 12b to clamp it from two sides. In addition, the magnetic heads 32 mounted on the arms 26e and 26f are respectively in contact with the upper and lower surfaces of the magnetic disk 12c to clamp it from two sides. The biasing force of each suspension 30 exerts a predetermined load applied to a corresponding magnetic head 32 to press it against the magnetic disk surface while the magnetic disk stands still.

On the other hand, as shown in FIG. 1, while the carriage assembly 14 is mounted in the case 10, the coil 44 fixed to the support frames 38 is positioned between a pair of yokes 48 fixed on the case 10, and constitutes the VCM 16, together with the yokes and a magnet (not shown) fixed on one of the yokes. When the coil 44 is energized, therefore, the carriage assembly 14 rotates, and the magnetic heads 32 move to be positioned on desired tracks on the magnetic disks 12a, 12b, and 12c.

Figure 4:
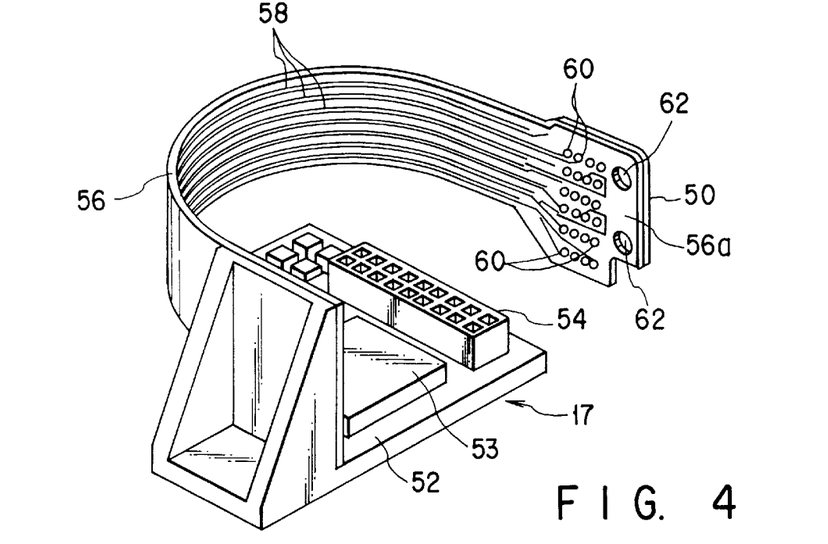
FIG. 4 is a perspective view of the board unit of the hard disk drive.

As shown in FIGS. 1 and 4, the board unit 17 has a rectangular board main body 52 fixed on the bottom wall of the case 10. A plurality of electronic parts 53 and connectors 54 and the like are mounted on this board main body 52. The board unit 17 has a belt-like main flexible printed circuit board (to be referred to as a main FPC hereinafter) 56 which electrically connects the board main body 52 to the carriage assembly 14. The main FPC 56 extends from the board main body 52. A reinforcing plate 50 is bonded to the rear surface of a leading end portion 56a of the main FPC 56. Note that the main FPC 56 is integrally formed with the board main body 52 by using a flexible printed wiring board.

Figure 5:
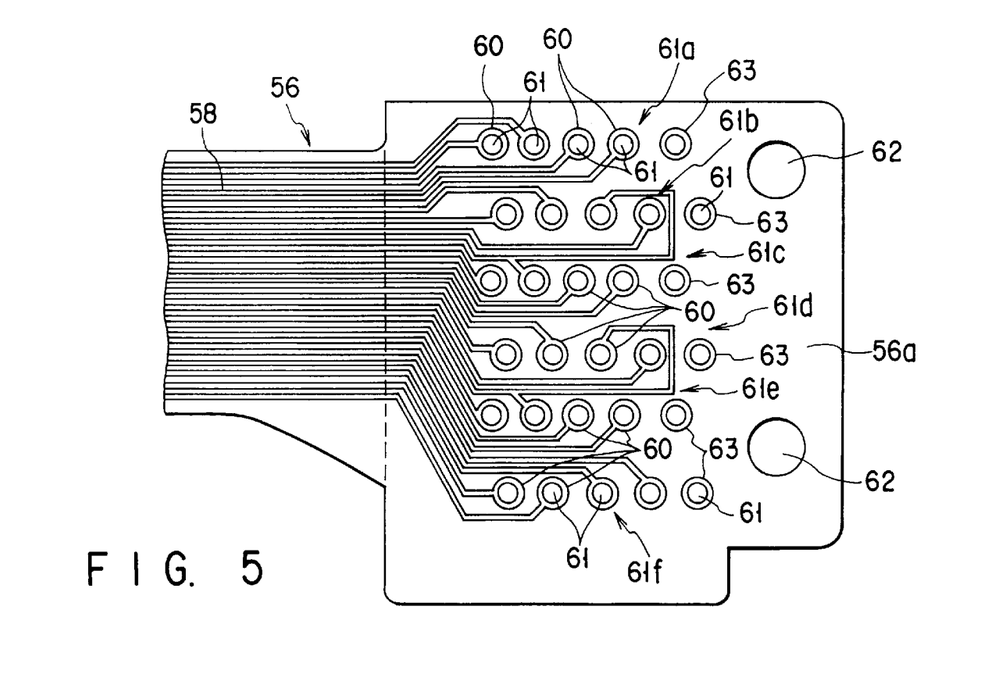
FIG. 5 is an enlarged plan view of the leading portion of the main FPC of the board unit.

As shown in FIGS. 4 and 5, the main FPC 56 has many conductor lines 58 extending parallel in the axial direction of the FPC. Six sets 61a to 61f of connection pads 60 are formed on the main FPC 56 in correspondence with the number of magnetic heads 32 to be electrically connected to the board main body 52 through the conductor lines 58. The connection pads 60 are arranged in sets each of four pads in correspondence with the number of electrodes of the magnetic heads 32. The connection pads 60 of each set are arranged in a predetermined arrangement, i.e., in a straight line at predetermined intervals in the axial direction of the main FPC 56. The sets 61a to 61f are arranged parallel to each other at predetermined intervals in a direction perpendicular to the axial direction of the main FPC 56.

Each of the sets 61a to 61f includes a reinforcing auxiliary pad 63 formed adjacent to the connection pads 60.

Each of the connection pads 60 and the auxiliary pads 63 has a circular shape and is pre-coated with solder 61 in a hemispherical form in advance. A pair of through holes 62 are formed in the leading end portion 56a to fix it to the bearing assembly 18 of the carriage assembly 14 with screws.

The leading end portion 56a of the main FPC 56 is fixed to the bearing assembly 18 of the carriage assembly 14 by screwing screws 66 (see FIG. 8) into screw holes 65a and 65b (see FIG. 3) formed in the spacer rings 27a and 27b through the through holes 62.

Each magnetic head 32 of the carriage assembly 14 is electrically connected to a corresponding connection pad set of the main FPC 56 through a head flexible printed circuit board (to be referred to as a head FPC hereinafter) 70. As shown in FIGS. 2 and 6A to 8, the head FPC 70 is welded and fixed to the surfaces of each arm and each suspension 30 of the carriage assembly 14 and extends from the distal end of the suspension to the proximal end of the arm.

Figures 6A, 6B:
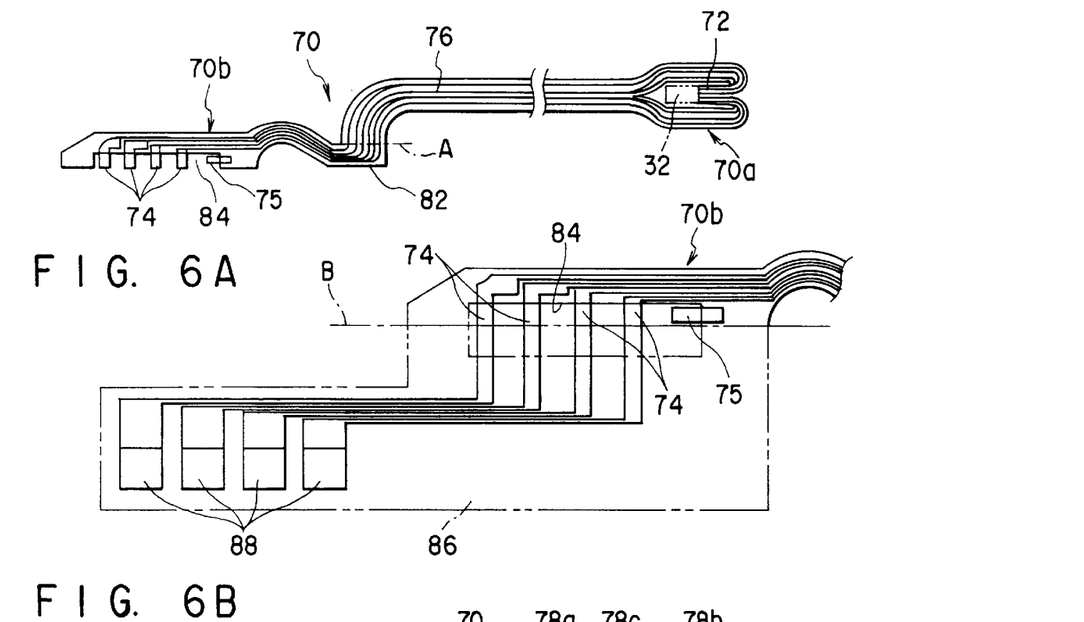
FIGS. 6A and 6B are plan views of head FPCs.

Each head FPC 70 has an elongated belt-like shape as a whole, and includes a distal end portion 70a located at the distal end of the suspension 30 and a connecting end portion 70b extends from the proximal end of the arm. Four first electrode pads 72 electrically connected to the electrodes of the magnetic head 32 are formed on the distal end portion 70a. Four second electrode pads 74 and one auxiliary pad 75 are formed on the connecting end portion 70b. Each second electrode pad 74 is electrically connected to the corresponding first electrode pad 72 through a conductor line 76.

Figure 7:
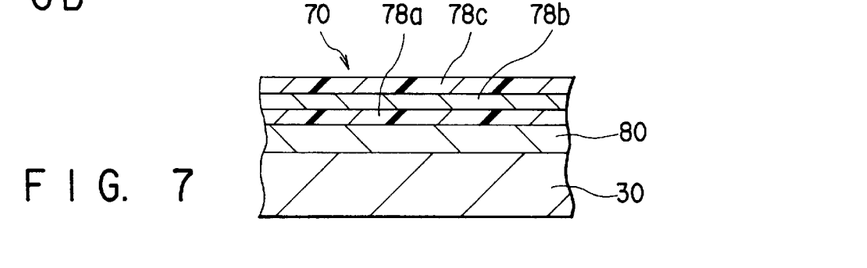
FIG. 7 is a sectional view of the head FPC and a suspension.

The head FPC 70 includes a base layer 78a consisting of an insulating material such as a polyimide, a conductor pattern 78b made of a copper foil formed on the base layer 78a and forming the first and second electrode pads 72 and 74 and the conductor line 76, and a cover layer 78c consisting of an insulating material and formed on the conductor pattern 78b on the base layer 78a. A thin plate (to be referred to as a flexure hereinafter) 80 consisting of stainless steel and having a thickness of 30 μm is bonded to the rear surface of the base layer 78a. The head FPC 70 is fixed to the carriage assembly 14 while the flexure 80 is in contact with the surface of the arm and the suspension 30.

The head FPC 70 also has a bent portion 82 formed on the end of the flexure 80 on the connecting end portion 70b side. The bent portion 82 is bent at right angles along a folding line A indicated by the dot and dashed line in FIG. 6A. With this structure, the connecting end portion 70b of the head FPC 70 bends at right angles with respect to the surface of the arm and extends parallel to the leading end portion 56a of the main FPC 56 fixed to the bearing assembly 18.

The connecting end portion 70b has an elongated rectangular shape extending in the extending direction of the arm, i.e., the longitudinal direction of the main FPC 56, and a rectangular recess portion 84 is formed in one side edge of the connecting end portion 70b. The four second electrode pads 74 are arranged side by side at predetermined intervals in the longitudinal direction of the connecting end portion 70b, and extend parallel to each other in a direction perpendicular to the longitudinal direction of the main FPC 56, i.e., the direction of width of the connecting end portion 70b. The four second electrode pads 74, in particular, are formed in the same arrangement as that of the four connection pads 60 of the corresponding set on the main FPC 56 side.

In addition, the respective second electrode pads 74 extend into the recess portion 84. That is, those portions of the base layer 78a and the cover layer 78c of the head FPC 70 which are located at the second electrode pads 74 are removed to expose the respective second electrode pads 74. In addition, that portion of the base layer 78a which is located at the first electrode pads 72 is removed to expose the respective first electrode pads 72. The surface of each first electrode pad 72 is pre-coated with solder.

In addition to the connection pads 60 of the main FPC 56, or instead of the connection pads 60, the surfaces of the second electrode pads 74 may be pre-coated with solder.

The auxiliary pad 75 is formed on the connecting end portion 70b of the head FPC 70 to extend into the recess portion 84. As will be described later, this reinforcing pad 75 is soldered to the corresponding auxiliary pad 63 on the main FPC 56 side to increase the connection strength of the connecting end portion 70b with respect to the main FPC 56.

The head FPC 70 integrally has an inspection end portion 86 for inspecting the magnetic head 32 before the carriage assembly is assembled. As is apparent from FIG. 6B, the inspection end portion 86 extends from the connecting end portion 70b. The inspection end portion 86 has four head inspection pads 88 electrically connected to the second electrode pads 74. That is, the head inspection pads 88 is formed by extending the conductor pattern forming the second electrode pads 74.

The magnetic head 32 can be inspected by bringing an inspection probe into contact with each head inspection pads 88 while the head FPC 70 is fixed on the arm and the suspension 30 and the magnetic head 32 is connected to the first electrode pads 72. After the inspection, the inspection end portion 86 is cut from the connecting end portion 70b along a cutting line B indicated by the dot and dashed line in FIG. 6B.

Figure 8:
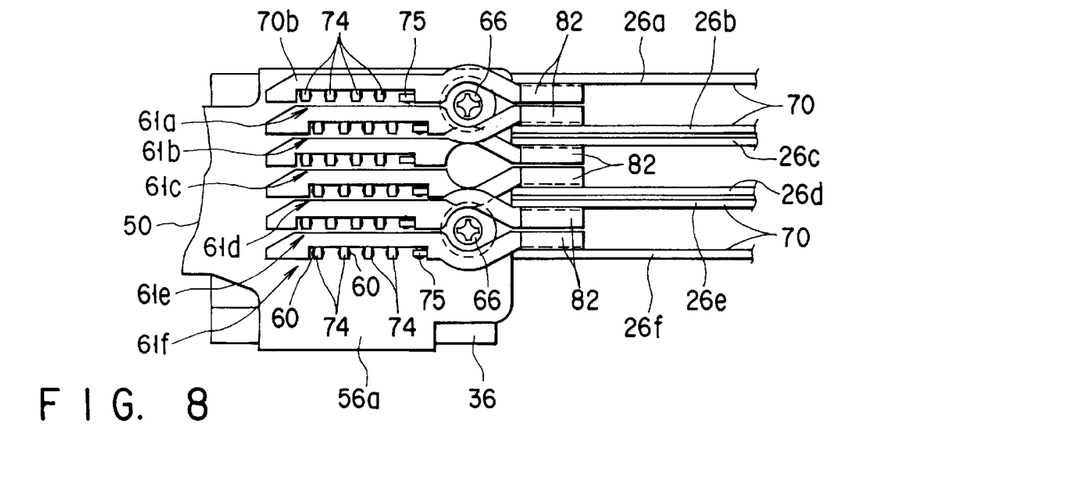
FIG. 8 is a side view of a connecting portion between the leading end portion of the main FPC and the head FPCs in the carriage assembly.

The connecting end portion 70b of each head FPC 70 having the above arrangement is fixed to the leading end portion 56a of the main FPC 56 by soldering the second electrode pads 74 to the connection pads 60 of the corresponding set on the main FPC 56 side. In this case, each connecting end portion 70*b* is arranged such that the four second electrode pads 74 are positioned on the four connection pads 60 of the corresponding set. In this state, the solder 61 on the connection pads 60 is melted by laser irradiation, a pulse heater, a soldering iron, or the like to bond the respective second electrode pads 74 to the corresponding connection pads 60. With this process, the respective magnetic heads 32 are electrically connected to the board unit 17 through the head FPCs 70 and the main FPC 56.

The reinforcing pad 75 formed on each connecting end portion 70*b* is soldered to the auxiliary pad 63 of the leading end portion 56*a* of the main FPC 56 to increase the connection strength of the connecting end portion 70*b* with respect to the main FPC 56.

Figure 9:
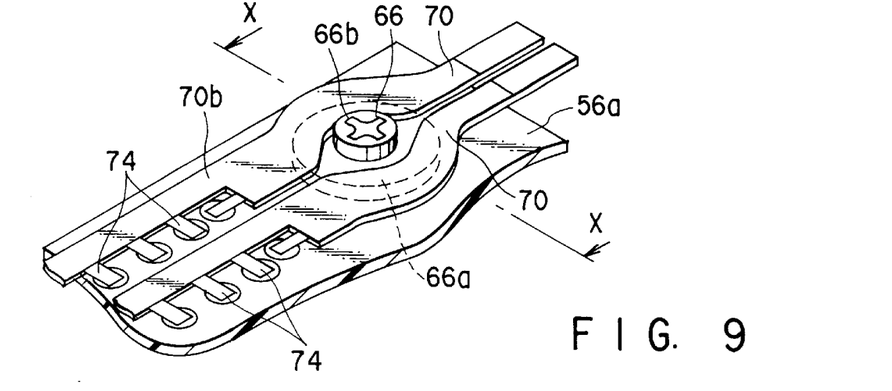
FIG. 9 is a perspective view showing a screwing portion between the main FPC and the head FPCS.
Figure 10:
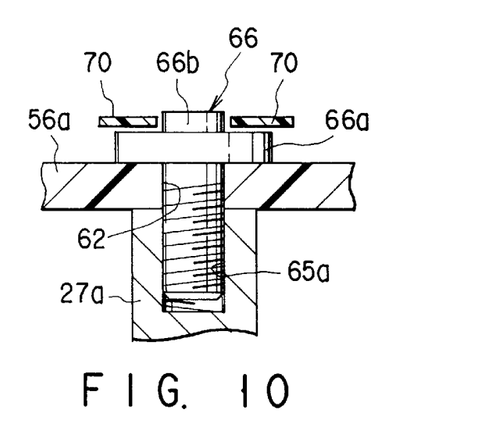
FIG. 10 is a sectional view taken along a line X—X in FIG. 9.

As shown in FIGS. 9 and 10, the head portion of the screw 66 for fixing the leading end portion 56*a* of the main FPC 56 to the carriage assembly 14 has a large-diameter proximal end portion 66*a* and a small-diameter distal end portion 66*b* protruding from the center of the proximal end portion 66*a*. Each screw 66 is screwed into the screw hole of the spacer ring while the lower surface of the proximal end portion 66*a* is in contact with the surface of the main FPC 56. The connecting end portion 70*b* of the head FPC 70 detours the distal end portion 66*b* of the screw 66 and extends along the upper surface of the proximal end portion 66*a*.

According to the magnetic disk apparatus having the above arrangement, when the connecting end portion 70*b* of the head FPC 70 is to be connected to the connection pad 60 of the head FPC 70, since the second electrode pads 74 of the head FPC 70 are formed in the same arrangement as that of the connection pads 60 of the corresponding set, the four second electrode pads 74 can be simultaneously and easily positioned with respect to the four connection pads 60. The four second electrode pads 74 can be simultaneously soldered to the connection pads 60 by laser irradiation, a pulse heater, a soldering iron, or the like.

Even if, therefore, the number of magnetic head signal lines connected increases to improve the capacity of the HDD, the head FPCs 70 can be easily connected to the main FPC 56, shortening the work time. Connection can be performed with constant precision regardless of the skill of the worker, as compared with the prior art, thereby suppressing the occurrence of connection faults and improving the reliability.

The head portion of each screw 66 for fixing the leading end portion 56*a* of the main FPC 56 to the carriage assembly 14 has the large-diameter proximal end portion 66*a* and the small-diameter distal end portion 66*b* projecting from the center of the proximal end portion 66*a*. The connecting end portion 70*b* of the head FPC 70 detours the distal end portion 66*b* of the screw 66 and extends along the upper surface of the proximal end portion 66*a*. With this structure, when the head FPCs 70 are layed out, the head portions of the screws 66 hardly interfere with the layout operation. The connecting end portions 70*b* of the head FPCs 70 can therefore be arranged with a high space efficiency.

Figure 11:
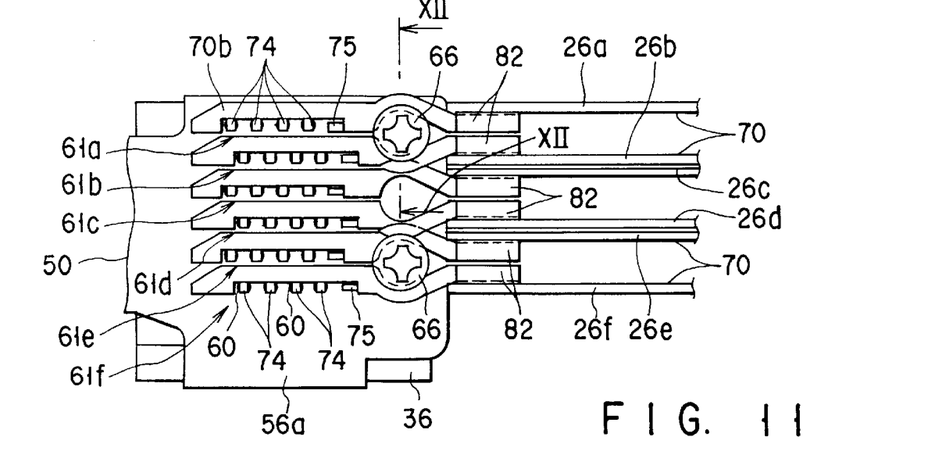
FIG. 11 is a side view corresponding to FIG. 8 and showing a modification of each screw for fixing the main FPC.
Figure 12:
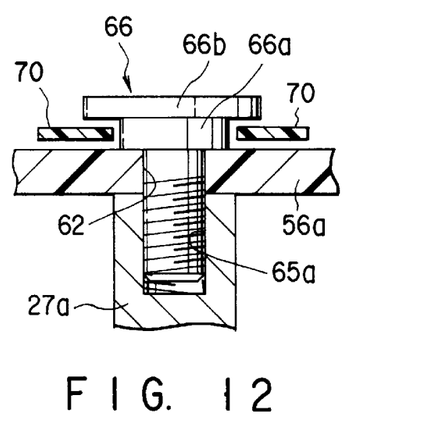
FIG. 12 is a side view taken along a line XII—XII in FIG. 11.

As shown in FIGS. 11 and 12, the head portion of each screw 66 may be formed such that the proximal end portion 66*a* has a small-diameter and the distal end portion 66*b* has a large-diameter. In this case, the connecting end portion 70*b* of each head FPC 70 is layed out through the gap between the distal end portion 66*b* of the screw 66 and the surface of the main FPC 56. With the use of these screws 66 as well, the connecting end portions 70*b* of the head FPCs 70 can be arranged with a high space efficiency with the head portions of the screws 66 hardly interfering with this layout operation.

Figure 13:
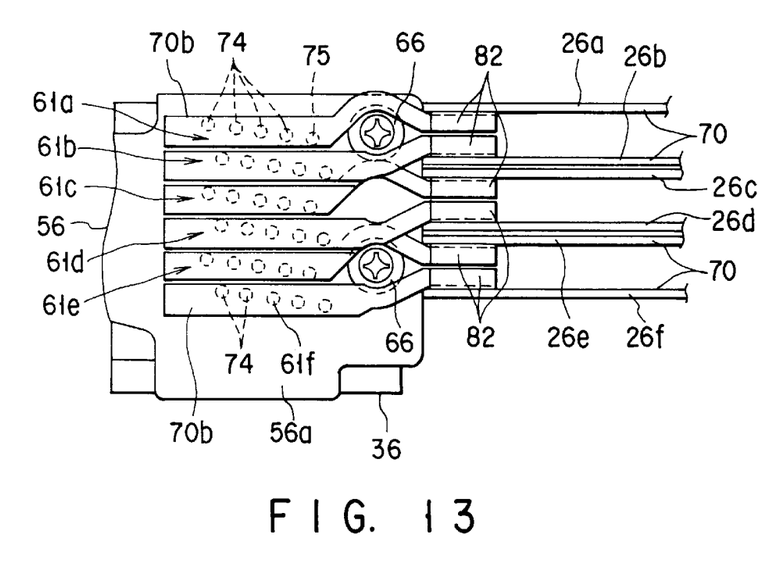
FIG. 13 is a side view of a connecting portion between the leading end portion of a main FPC and head FPCs in an HDD according to a second embodiment of the present invention.
Figure 14:
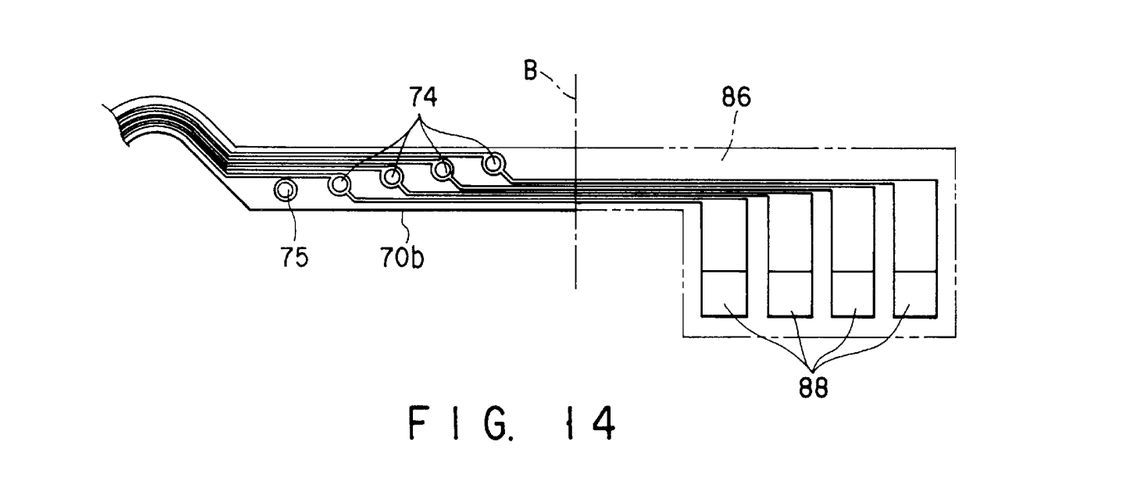
FIG. 14 is a plan view of the connecting end portion and head inspection end portion of the head FPC according to the second embodiment.

FIGS. 13 and 14 show the main part of an HDD according to a second embodiment of the present invention. According to the second embodiment, a connecting end portion 70*b* of each head FPC 70 has an elongated rectangular shape extending in the longitudinal direction of a main FPC 56. Four second electrode pads 74 and a reinforcing pad 75 are formed into circles and arranged in a straight line at predetermined intervals in a direction inclined with respect to the longitudinal direction of the main FPC 56. That portion of the cover layer of the head FPC 70 which corresponds to the respective second electrode pads 74 is removed to expose the surfaces of the second electrode pads 74.

Connection pads 60 of each set of the main FPC 56 are also formed into circles and arranged in a straight line at predetermined intervals in a direction inclined with respect to the longitudinal direction of the main FPC 56. That is, the second electrode pads 74 and the connection pads 60 have the same arrangement. At least one of the second electrode pad 74 and the connection pad 60 is pre-coated with solder.

The four second electrode pads 74 of the connecting end portion 70*b* of the head FPC 70 are stacked on the four connection pads 60 of the corresponding set. In this state, the solder on the second electrode pads 74 or the connection pads 60 is melted by laser irradiation, a pulse heater, a soldering iron, or the like so as to bond the second electrode pads 74 to the corresponding the connection pads 60.

The reinforcing pad 75 formed on each connecting end portion 70*b* is soldered to a corresponding auxiliary pad 63 of a leading end portion 56*a* to increase the connection strength of the connecting end portion 70*b* with respect to the main FPC 56.

Before each head FPC 70 is connected to the main FPC 56, the head FPC 70 integrally has an inspection end portion 86 extending from the connecting end portion 70*b* and having head inspection pads 88. Other arrangements of the second embodiment are the same as those of the first embodiment described above. The same reference numerals in the second embodiment denote the same parts as in the first embodiment, and a detailed description thereof will be omitted.

In the second embodiment having the above arrangement, as in the first embodiment, the head FPCs 70 can be easily connected to the main FPC 56, and the time required for this operation can be shortened. Connection can be performed with constant precision regardless of the skill of the worker, as compared with the prior art, thereby suppressing the occurrence of connection faults and improving the reliability.

In addition, according to the second embodiment, since the connection pads 60 of the main FPC 56 and the second electrode pads 74 of the head FPCs 70 are arranged in a direction inclined with respect to the longitudinal direction of the main FPC 56, the height of the leading end portion 56*a* and the width of each connecting end portion 70*b* can be decreased.

Figure 15:
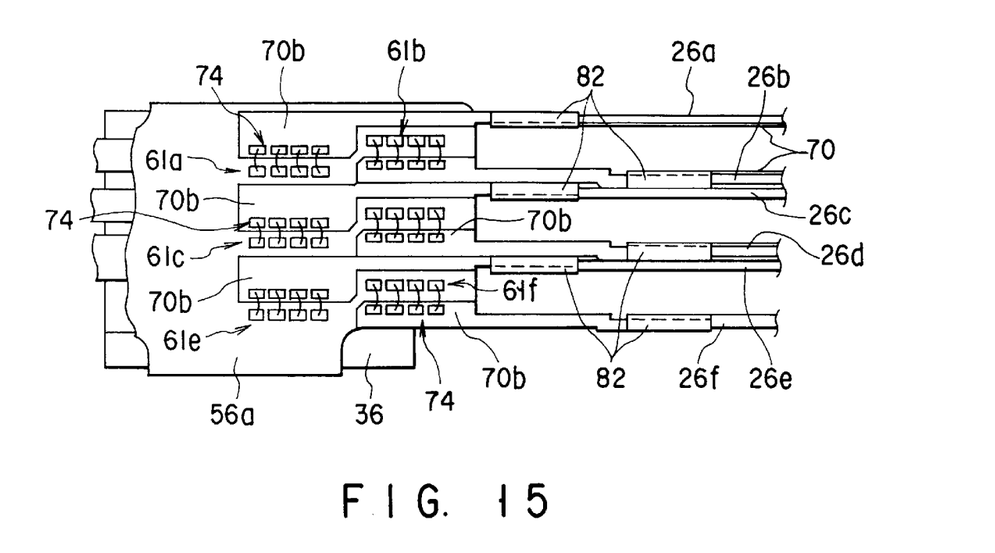
FIG. 15 is a side view of a connecting portion between the leading end portion of a main FPC and head FPCs in an HDD according to a third embodiment of the present invention.
Figure 16:
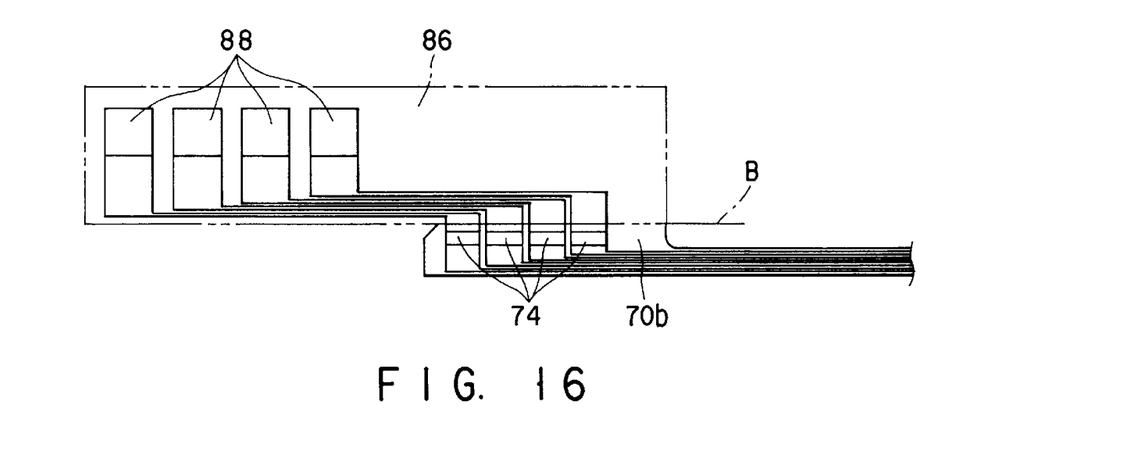
FIG. 16 is a plan view of the connecting end portion and head inspection end portion of the head FPCs according to the third embodiment.

According to a third embodiment of the present invention in FIGS. 15 and 16, second electrode pads 74 formed on connecting end portions 70*b* of head FPCs 70 are electrically connected to corresponding connection pads 60 of a main FPC 56 by wire bonding.

More specifically, the connection pads 60 of the respective sets formed on a leading end portion 56*a* of the main FPC 56 are arranged in sets each of four pads in the longitudinal direction of the main FPC 56. Each connection pad 60 has an elongated rectangular shape extending in the longitudinal direction of the main FPC 56.

The second electrode pads 74 formed on the connecting end portions 70b of the head FPCs 70 have the same arrangement as that of the connection pads 60 and are arranged in sets each of four pads in the longitudinal direction of the main FPC 56. Each second electrode pad 74 has an elongated rectangular shape extending in the longitudinal direction of the main FPC 56. Note that each second electrode pad 74 is exposed by removing a corresponding cover layer portion of the head FPC 70. The surfaces of the second electrode pads 74 and the connection pads 60 are plated with gold or solder.

The connecting end portion 70b of each head FPC 70 is bonded/fixed on the leading end portion 56a of the main FPC 56 to be adjacent to the connection pads 60 of the corresponding set. The second electrode pads 74 are positioned to be parallel/adjacent to the connection pads 60 and oppose them. Each second electrode pad 74 is connected to a corresponding connection pad 60 by wire bonding.

Before each head FPC 70 is connected to the main FPC 56, the head FPC 70 integrally has an inspection end portion 86 extending from the connecting end portion 70b and having head inspection pads 88. Other arrangements of the second embodiment are the same as those of the first embodiment described above. The same reference numerals in the second embodiment denote the same parts as in the first embodiment, and a detailed description thereof will be omitted.

According to the third embodiment, since the second electrode pads 74 of each head FPC 70 have the same arrangement as that of the connection pads 60 of the corresponding set, the second electrode pads can be easily and accurately positioned with respect to the connection pads when they are connected to each other. Therefore, the connection pads 60 and the second electrode pads 74 can be easily connected to each other by wire bonding. The time required for connection can be shortened, and the connection process can be automated. In addition, the occurrence of connection faults can be suppressed, and the reliability can be improved.

When wire bonding is used, the area of each pad can be decreased, and hence an increase in the number of pads can be easily handled. Each pad has an elongated rectangular shape extending in the longitudinal direction of the main FPC. For this reason, in a repair process, wire bonding can be performed at a position shifted from the initial wire bonding position.

Figure 17:
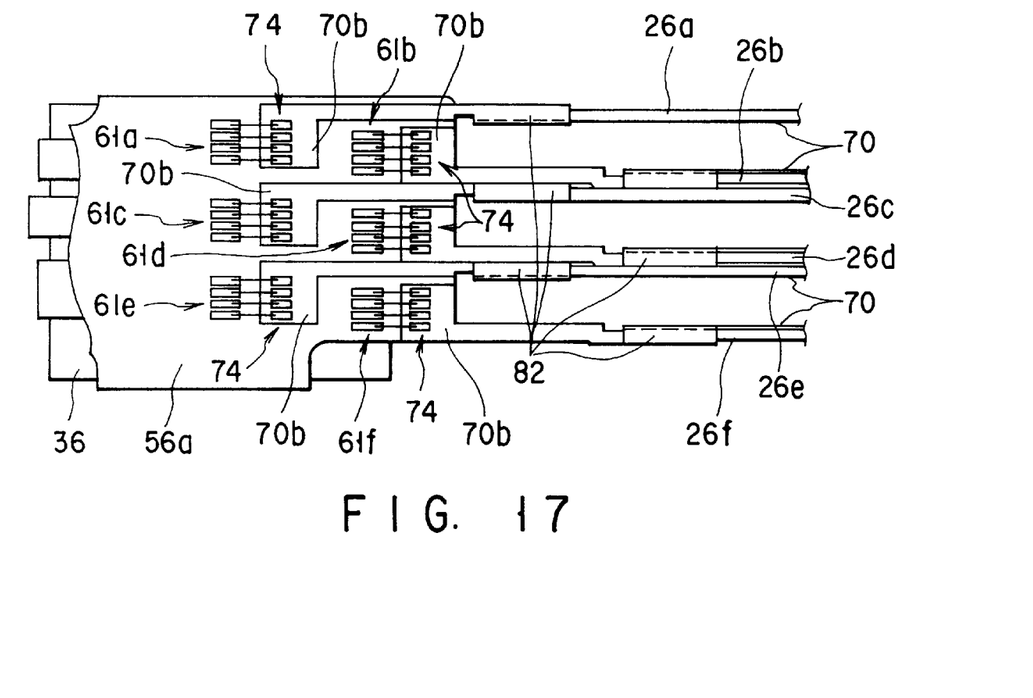
FIG. 17 is a side view of a connecting portion between the leading end portion of a main FPC and head FPCs in an HDD according to a fourth embodiment of the present invention.
Figure 18:
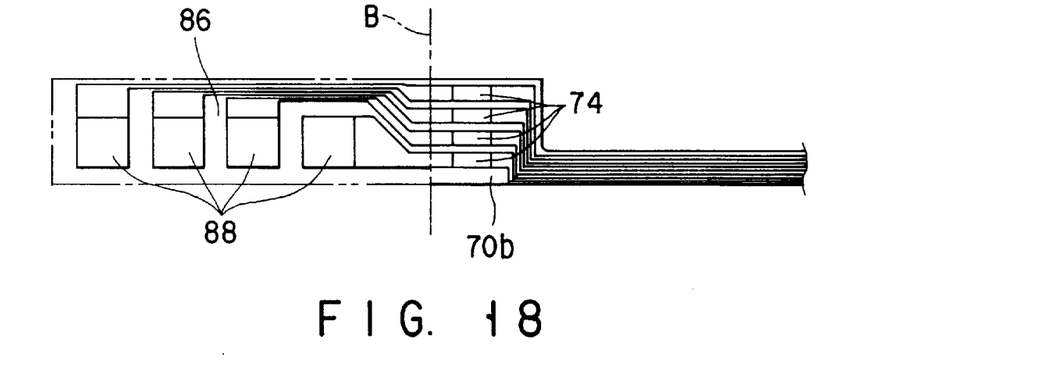
FIG. 18 is a plan view of the connecting end portion and head inspection end portion of the head FPCs according to the fourth embodiment.

According to the fourth embodiment of the present invention in FIGS. 17 and 18, similar to the third embodiment, second electrode pads 74 formed on a connecting end portion 70b of each head FPC 70 are electrically connected to corresponding connection pads 60 of a main FPC 56 by wire bonding.

According to the fourth embodiment, the second electrode pads 74 of the respective head FPCs 70 and the connection pads 60 of the respective sets of the main FPC 56 are arranged side by side in a direction perpendicular to the longitudinal direction of the main FPC 56. Each pad has an elongated rectangular shape extending in the longitudinal direction of the main FPC 56. Other arrangements of the fourth embodiment are the same as those of the third embodiment. The same reference numerals in the fourth embodiment denote the same parts as in the third embodiment, and a detailed description thereof will be omitted.

In the fourth embodiment having the above arrangement as well, the same effects as those in the third embodiment can be obtained.

The present invention is not limited to the above embodiments, and various changes and modifications can be made within the spirit and scope of the invention.

For example, the number of magnetic heads is not limited to six, and may be increased/decreased in accordance with the number of magnetic disks. In addition, the arrangements of the connection pads on the main FPC side and the second electrode pads on the head FPC side are not limited to the arrangements constituted by linear arrays and may be changed as needed as long as the connection pads and the second electrode pads have the same arrangement.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks;

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly includes a head flexible printed circuit board provided on each of the arm portions to electrically connect the respective magnetic heads to the connection pads of a corresponding set, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the second electrode pads of each of the connecting end portions are arranged in the same manner as the connection pads of the corresponding set and stacked and soldered thereon, each of the head flexible printed circuit boards comprising a base layer, a conductor pattern formed on the base layer, and a cover layer formed on the conductor pattern on the base layer, and each of the second electrode pads is formed by using part of the conductor pattern and has an upper surface, a lower surface, and a side edge, which are exposed by partly removing the base and cover layers, and at least one of the second electrode pads and the connection pads is pre-coated with solder.

2. An apparatus according to claim 1, wherein the connection pads of each set are arranged in a straight line in a longitudinal direction of the main flexible printed circuit board.

3. An apparatus according to claim 1, wherein the connection pads of each set are arranged in a straight line in a direction inclined to a longitudinal direction of the main flexible printed circuit board.

4. An apparatus according to claim 1, wherein each of the second electrode pads have a cantilever shape.

5. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks:

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly includes a head flexible printed circuit board provided on each of the arm portions to electrically connect the respective magnetic heads to the connection pads of a corresponding set, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the second electrode pads of each of the connecting end portions are arranged in the same manner as the connection pads of the corresponding set and stacked and soldered thereon, the carriage assembly comprises a screw for fixing the leading end portion of the main flexible printed circuit board to the rotatable main body, the screw including a head portion having a large-diameter proximal end portion in contact with a surface of the leading end portion of the main flexible printed circuit board and a small-diameter distal end portion extending from the proximal end portion, and the connecting end portion of at least one of the head flexible printed circuit boards extends on a surface of the proximal end portion.

6. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks;

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly includes a head flexible printed circuit board provided on each of the arm portions to electrically connect the respective magnetic heads to the connection pads of a corresponding set, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the second electrode pads of each of the connecting end portions are arranged in the same manner as the connection pads of the corresponding set and stacked and soldered thereon, the carriage assembly comprises a screw for fixing the leading end portion of the main flexible printed circuit board to the rotatable main body, the screw including a head portion having a small-diameter proximal end portion in contact with a surface of the leading end portion of said main flexible printed circuit board and a large-diameter distal end portion extending from the proximal end portion, and the connecting end portion of at least one of the head flexible printed circuit boards extends between a gap between the surface of the leading end portion of the main flexible printed circuit board and the distal end portion of the screw.

7. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks;

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly includes a head flexible printed circuit board provided on each of the arm portions to electrically connect the respective magnetic heads to the connection pads of a corresponding set, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the second electrode pads of each of the connecting end portions are arranged in the same manner as the connection pads of the corresponding set and stacked and soldered thereon, of each of the respective arm portions, each of the head flexible printed circuit boards comprises a base layer, a conductor pattern formed on the base layer, a cover layer formed on the conductor pattern on the base layer, a metal thin plate fixed to a lower surface of a portion excluding the connecting end portion, and a bent portion formed by bending the metal thin plate with the connecting end portion being set at substantially right angles with respect to a surface of each of the respective arm portions, each of the second electrode pads is formed by using part of the conductor pattern exposed by partly removing the base and cover layers, and at least one of the second electrode pads and the connection pads is pre-coated with solder.

8. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks;

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly comprises a head flexible printed circuit board provided on each of the arm portions to electrically connect the respective magnetic heads to the connection pads of a corresponding set, and a screw for fixing the leading end portion of the main flexible printed circuit board to the rotatable main body, the screw including a head portion having a large-diameter proximal end portion in contact with a surface of the leading end portion of the main flexible printed circuit board and a small-diameter distal end portion extending from the proximal end portion, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the connecting end portion of at least one of the head flexible printed circuit boards extending on a surface of the proximal end portion of the screw, the second electrode pads of each of the connecting end portions are arranged in the same manner as the connection pads of the corresponding set and stacked and soldered thereon, each of the head flexible printed circuit boards comprises a base layer, a conductor pattern formed on the base layer, and a cover layer formed on the conductor pattern on the base layer, and each of the second electrode pads is formed by using part of the conductor pattern exposed by partly removing the base and cover layers, and at least one of the second electrode pads and the connection pads is pre-coated with solder.

9. A magnetic disk apparatus comprising:

a plurality of magnetic disks stacked on each other at predetermined intervals;

a plurality of magnetic heads arranged to oppose upper and lower surfaces of each of the magnetic disks, for recording/reproducing information on/from the magnetic disks;

a carriage assembly including a rotatable main body, and a plurality of arm portions extending from the main body and respectively supporting the magnetic heads, for supporting the magnetic heads to be movable with respect to the magnetic disks;

driving means for rotating the carriage assembly to move the magnetic heads to desired positions on the magnetic disks; and a board unit for inputting/outputting read and write signals with respect to the magnetic heads, wherein the board unit includes a board main body, a belt-like main flexible printed circuit board extending from the board main body and having a leading end portion fixed to the rotatable main body of the carriage assembly, and a plurality of connection pads formed on the leading end portion of the main flexible printed circuit board in sets corresponding to the number of magnetic heads, the connection pads of the respective sets being formed in a predetermined arrangement, the carriage assembly includes a head flexible printed circuit board provided on each of the arm portions to electrically connect the respective magnetic heads to the connection pads of a corresponding set, and a screw for fixing the leading end portion of the main flexible printed circuit board to the rotatable main body, the screw including a head portion having a small-diameter proximal end portion in contact with a surface of the leading end portion of said main flexible printed circuit board and a large-diameter distal end portion extending from the proximal end portion, each of the head flexible printed circuit boards includes a distal end portion having a plurality of first electrode pads to which the magnetic head is connected, a connecting end portion extending from a proximal end portion of a respective one of the arm portions, and a plurality of second electrode pads connected to the connection pads of the corresponding set, the connecting end portion of at least one of the head flexible printed circuit boards extends between a gap between the surface of the leading end portion of the main flexible printed circuit board and the distal end portion of the screw, the second electrode pads of each of the connecting end portions are arranged in the same manner as the connection pads of the corresponding set and stacked and soldered thereon, each of the head flexible printed circuit boards comprises a base layer, a conductor pattern formed on the base layer, and a cover layer formed on the conductor pattern on the base layer, and each of the second electrode pads is formed by using part of the conductor pattern exposed by partly removing the base and cover layers, and at least one of the second electrode pads and the connection pads is pre-coated with solder.

* * * * *

UNITED STATES PATENT AND TRADEMARK OFFICE
CERTIFICATE OF CORRECTION

PATENT NO.    : 5,995,322
DATED         : November 30, 1999
INVENTOR(S)   : Shigeki YANAGIHARA It is certified that error appears in the above-identified patent and that said Letters Patent is hereby corrected as shown below:

Title Page, Item [57], in the Abstract, line 9, "electrodes pads" should read --electrode pads--.

Claim 4, Col. 13, line 18, "have" should read --has--.

\* Claim 7, Col. 15, lines 34-35, after "thereon," delete "of each of the respective arm portions".

Signed and Sealed this

Fourteenth Day of November, 2000

Attest:

Attesting Officer

Q. TODD DICKINSON

Director of Patents and Trademarks